United States Patent
Hong et al.

(10) Patent No.: US 12,200,987 B2
(45) Date of Patent: Jan. 14, 2025

(54) TRANSPARENT DISPLAY DEVICE CAPABLE OF INCREASING SIZE OF TRANSMISSIVE AREA

(71) Applicant: LG Display Co., Ltd., Seoul (KR)

(72) Inventors: Soonhwan Hong, Paju-si (KR); ChangSoo Kim, Paju-si (KR); Hyeokjun Kwon, Paju-si (KR); Kyungah Chin, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 513 days.

(21) Appl. No.: 17/530,132

(22) Filed: Nov. 18, 2021

(65) Prior Publication Data
US 2022/0165836 A1      May 26, 2022

(30) Foreign Application Priority Data
Nov. 24, 2020    (KR) .......................... 10-2020-0158882

(51) Int. Cl.
*H10K 59/131*    (2023.01)
*H10K 59/35*    (2023.01)
(52) U.S. Cl.
CPC ......... *H10K 59/131* (2023.02); *H10K 59/353* (2023.02)

(58) Field of Classification Search
CPC ........................... H10K 59/131; H10K 59/353
USPC ............................................................ 257/40
See application file for complete search history.

(56) References Cited

U.S. PATENT DOCUMENTS

| 9,865,668 | B2 | 1/2018 | Sato |
| 2019/0384960 | A1 | 12/2019 | Kwon et al. |
| 2020/0312926 | A1* | 10/2020 | Bae ...................... H10K 59/126 |

FOREIGN PATENT DOCUMENTS

| KR | 10-2014-0080652 A | 7/2014 |
| KR | 10-2016-0126876 A | 11/2016 |
| KR | 10-2018-0085288 A | 7/2018 |

* cited by examiner

*Primary Examiner* — Quoc D Hoang
(74) *Attorney, Agent, or Firm* — Seed IP Law Group LLP

(57) ABSTRACT

A transparent display device may have high transmittance and at the same time have high resolution. The transparent display device comprises a first signal line portion extended in a first direction, including a first sensing scan line, a second sensing scan line, an initialization line and a light emission control line, a second signal line portion extended in a second direction, a transmissive area provided between two adjacent first signal line portions and between two adjacent second signal line portions, and a pixel provided in an intersection area where the first signal line portion and the second signal line portion cross or overlap each other. The light emission control line overlaps the initialization line in at least a partial area.

18 Claims, 10 Drawing Sheets

TRANSPARENT DISPLAY DEVICE CAPABLE OF INCREASING SIZE OF TRANSMISSIVE AREA

BACKGROUND

Technical Field

The present disclosure relates to a transparent display device.

Description of the Related Art

With advancement in information-oriented societies, demands for display devices that display an image have increased in various forms. Recently, various types of display devices such as a liquid crystal display (LCD) device, a plasma display panel (PDP) device, and an organic light emitting display (OLED) device, a quantum dot light emitting display (QLED) device have been widely utilized.

Recently, studies for transparent display devices for allowing a user to look at objects or image arranged on an opposite side of a display device after transmitting the display device are actively ongoing.

A transparent display device may have high light transmittance in a display area through a transmissive area. However, the resolution of the transparent display device may be deteriorated due to the transmissive area.

BRIEF SUMMARY

The inventors of the present disclosure have recognized that the transparent display device has a problem in that the higher resolution is, the more reduced transmittance is. Also, since a spaced distance between subpixels is increased due to the transmissive area in the transparent display device, an interval between the subpixels may be recognized or noticed by an user, whereby picture quality may be degraded.

The present disclosure has been made in view of various technical problems including the above technical problems, and various embodiments of the present disclosure provide a transparent display device that may improve transmittance and at the same time embody high resolution.

One or more embodiments of the present disclosure provide a transparent display device that prevents a subpixel interval from being perceived and has optimized image quality.

In addition to the technical benefits of the present disclosure as mentioned above, additional technical benefits and features of the present disclosure will be clearly understood by those skilled in the art from the following description of the present disclosure.

In accordance with an aspect of the present disclosure, the above and other technical benefits can be accomplished by the provision of a transparent display device comprising a first signal line portion extended in a first direction, including a first sensing scan line, a second sensing scan line, an initialization line and a light emission control line, a second signal line portion extended in a second direction, a transmissive area provided between two adjacent first signal line portions and between two adjacent second signal line portions, and a pixel provided in an intersection or overlapping area where the first signal line portion and the second signal line portion cross or overlap each other. The light emission control line overlaps the initialization line in at least a partial area.

In accordance with another aspect of the present disclosure, the above and other technical benefits can be accomplished by the provision of a transparent display device comprising a first signal line portion extended in a first direction, including a first line, a second signal line portion extended in a second direction, a transmissive area provided between two adjacent first signal line portions and between two adjacent second signal line portions, and a plurality of circuit areas disposed based on an intersection where the first signal line portion and the second signal line portion cross or overlap each other. The first light includes a straight line portion, and a divergence portion diverged from the straight line portion, providing a signal to each of the plurality of circuit areas.

BRIEF DESCRIPTION OF THE SEVERAL VIEWS OF THE DRAWINGS

The above and other objects, features and other advantages of the present disclosure will be more clearly understood from the following detailed description taken in conjunction with the accompanying drawings, in which.

DETAILED DESCRIPTION

Figure 1:
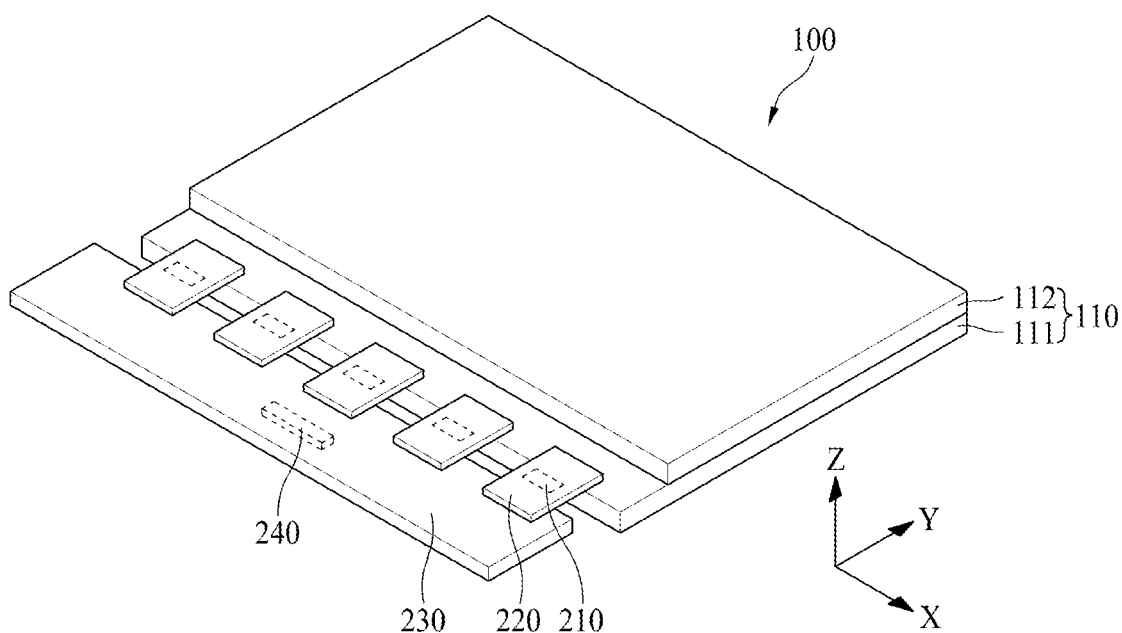
FIG. 1 is a perspective view illustrating a transparent display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~,' 'above~,' 'below~,' and 'next to~,' one or more portions may be arranged between two other portions unless 'just' or 'direct' is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," etc., may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless specially mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an example of a transparent display device according to the present disclosure will be described in detail with reference to the accompanying drawings. Wherever possible, the same reference numbers will be used throughout the drawings to refer to the same or like parts.

Figure 2:
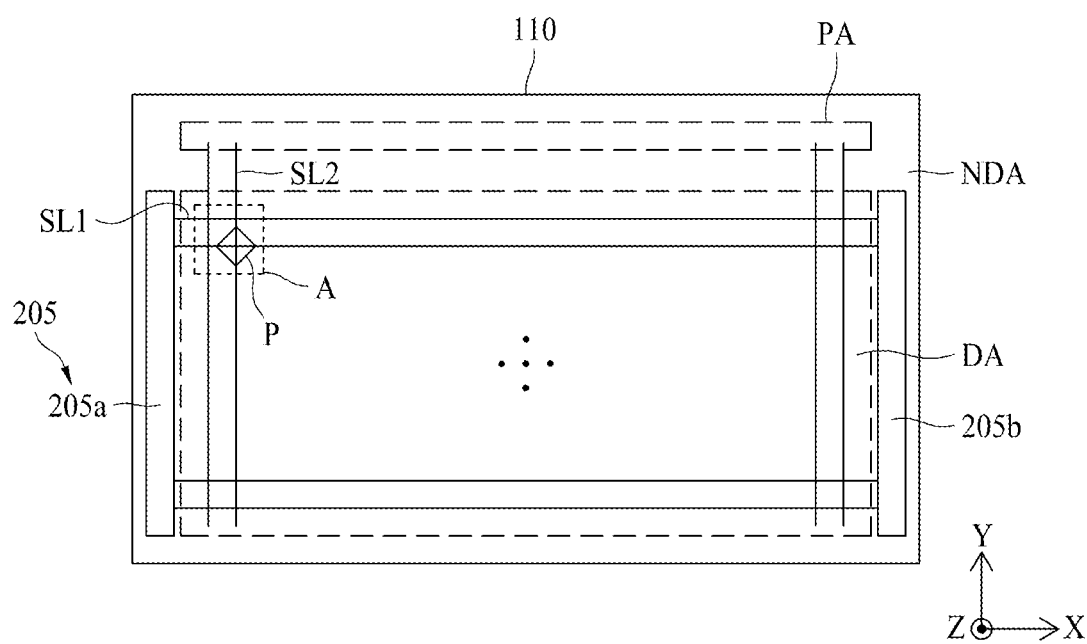
FIG. 2 is a schematic plane view illustrating a transparent display panel according to one embodiment of the present disclosure.

FIG. 1 is a perspective view illustrating a transparent display device according to one embodiment of the present disclosure, and FIG. 2 is a schematic plane view illustrating a transparent display panel.

Hereinafter, X-axis indicates a line parallel with a gate line, Y-axis indicates a line parallel with a data line, and Z-axis indicates a height direction of a transparent display device 100.

Although a description has been described based on that the transparent display device 100 according to one embodiment of the present disclosure is embodied as an organic light emitting display device, the transparent display device 100 may be embodied as a liquid crystal display device, a plasma display panel (PDP), a Quantum dot Light Emitting Display (QLED) or an Electrophoresis display device.

Referring to FIG. 1 and FIG. 2, the transparent display device 100 according to one embodiment of the present disclosure includes a transparent display panel 110, a source drive integrated circuit (IC) 210, a flexible film 220, a circuit board 230, and a timing controller 240.

The transparent display panel 110 includes a first substrate 111 and a second substrate 112, which face each other. The second substrate 112 may be an encapsulation substrate. The first substrate 111 may be a plastic film, a glass substrate, or a silicon wafer substrate formed using a semiconductor process. The second substrate 112 may be a plastic film, a glass substrate, or an encapsulation film. The first substrate 111 and the second substrate 112 may be made of a transparent material.

The substrate 111 may include a display area DA where pixels P are formed to display an image, and a non-display area NDA that does not display an image.

The display area DA may be provided with first signal line portions SL1, second signal line portions SL2 and pixels P, and the non-display area NDA may be provided with a pad area PA for pads and at least one of a gate driver 205.

The first signal line portions SL1 may be extended in a first direction (e.g., X-axis direction), and may cross or overlap the second signal line portions SL2 in the display area DA. The second signal line portions SL2 may be extended in a second direction (e.g., Y-axis direction). The pixels P may be provided in an area where the first signal line portions SL1 and the second signal line portions SL2 intersect, and emit predetermined light to display an image.

The gate driver 205 supplies gate signals to the gate lines in accordance with a gate control signal which is provided from the timing controller 240. The gate driver 205 may be provided in one side of the display area of the transparent display panel 110, or the non-display area of both peripheral sides of the transparent display panel 110 by a gate driver in panel (GIP) method. In another way, the gate driver 205 may be manufactured in a driving chip, may be mounted on the flexible film, and may be attached to one peripheral side or both peripheral sides of the display area of the transparent display panel 110 by a tape automated bonding (TAB) method.

For example, the gate driver 205, as shown in FIG. 2, may include a first gate driver 205a provided in the non-display area NDA disposed over a first peripheral side of the display area DA, and a second gate driver 205b provided in the non-display area NDA disposed over a second peripheral side of the display area DA, but is not limited thereto.

If the source drive IC 210 is manufactured in a driving chip, the source drive IC 140 may be mounted on the flexible film 220 by a chip on film (COF) method or a chip on plastic (COP) method.

Pads, such as power pads and data pads, may be formed in the pad area PA of the transparent display panel 110. Lines connecting the pads with the source drive IC 210 and lines connecting the pads with lines of the circuit board 230 may be formed in the flexible film 220. The flexible film 220 may be attached onto the pads using an anisotropic conducting film, whereby the pads may be connected with the lines of the flexible film 220.

Figure 3:
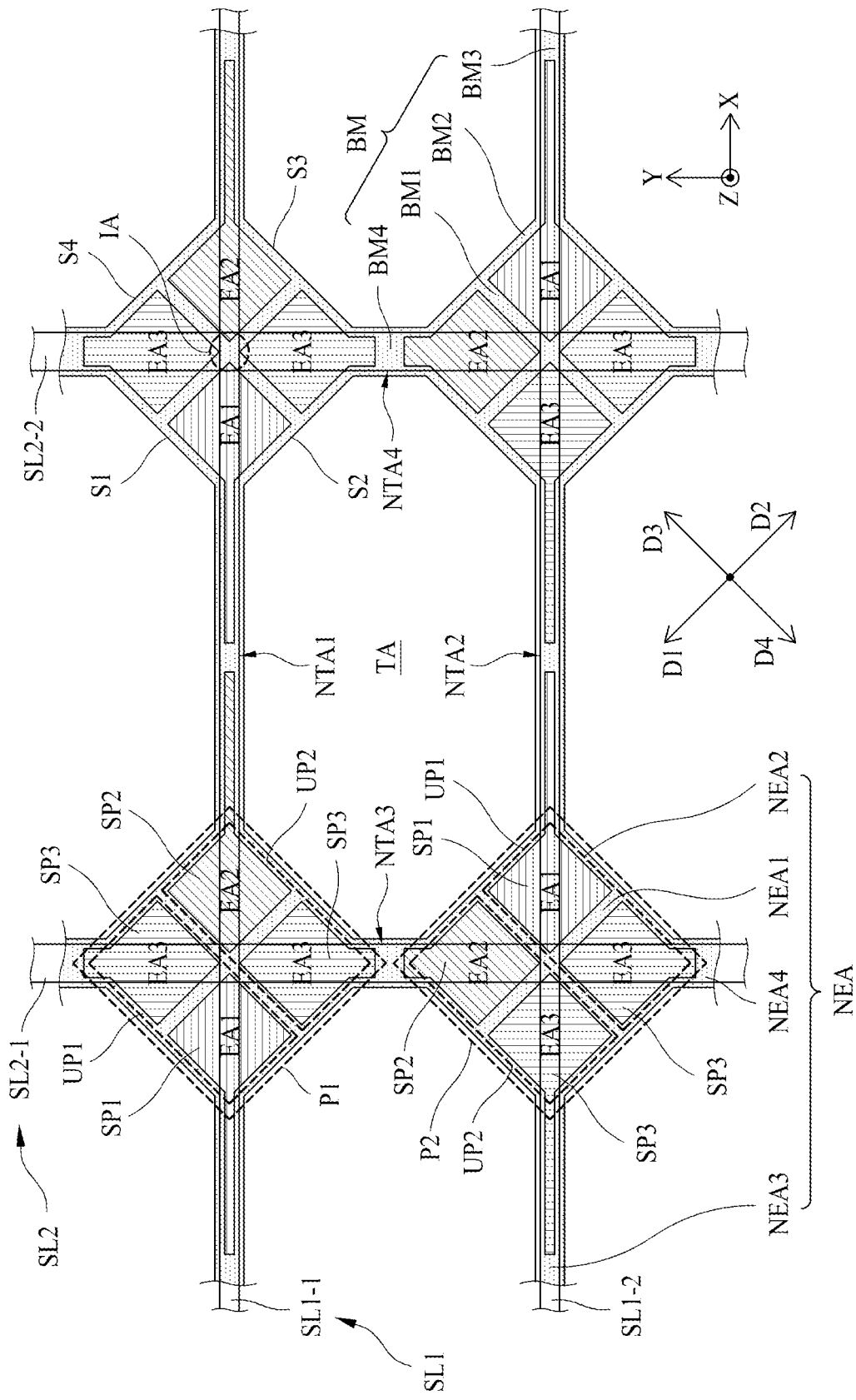
FIG. 3 is a schematic view illustrating an example of a pixel provided in an area A of FIG. 2.
Figure 4:
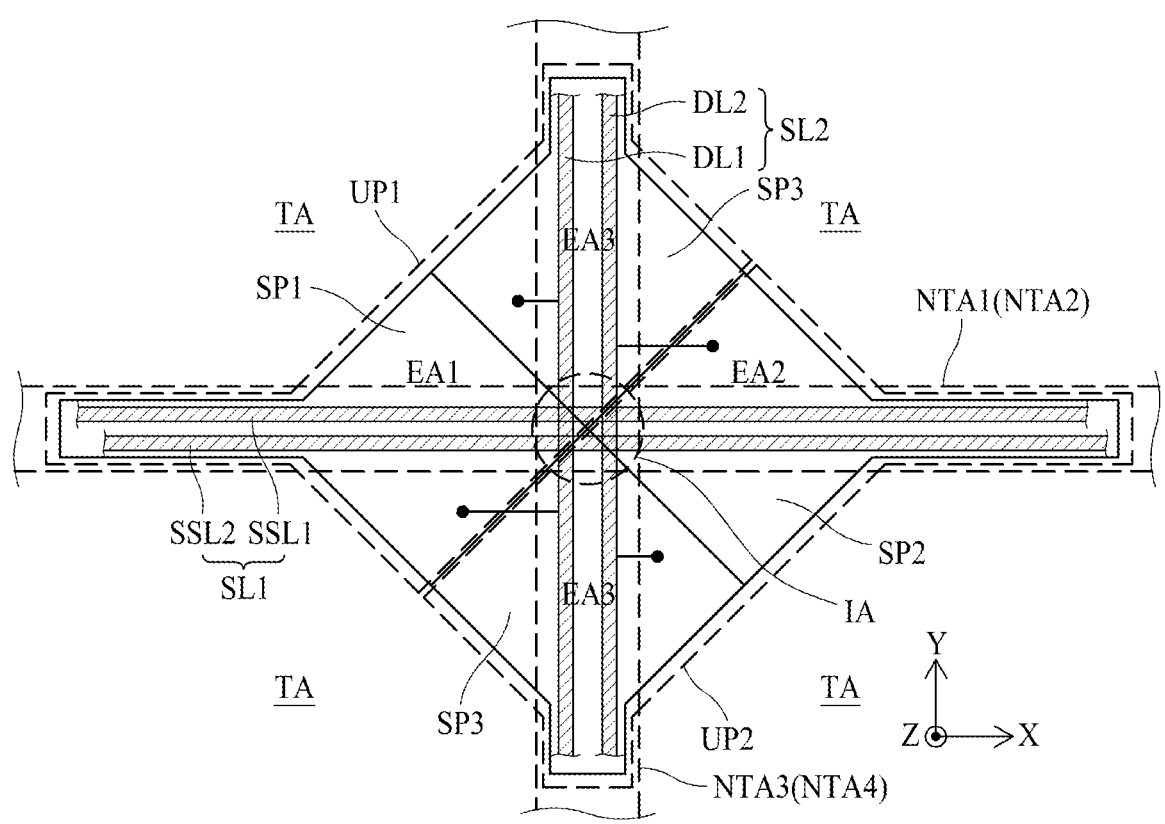
FIG. 4 is a schematic view illustrating a first signal line, a second signal line and a pixel.
Figure 5:
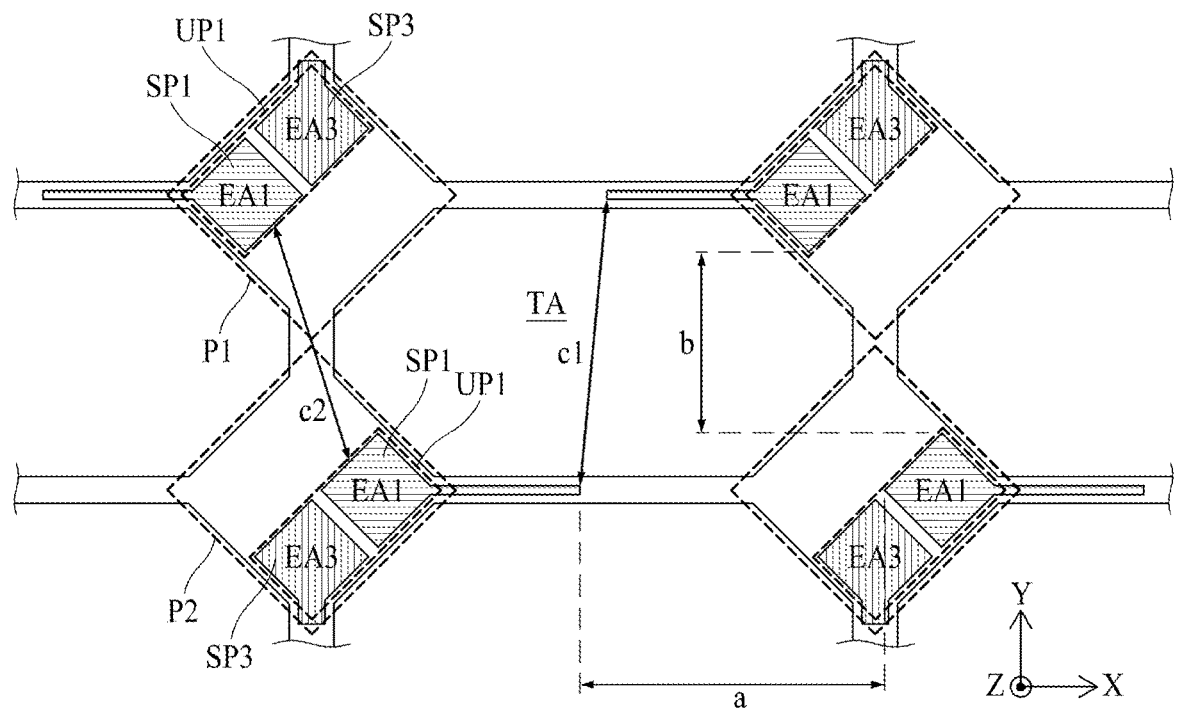
FIG. 5 is a view illustrating arrangement of subpixels included in a first unit pixel.
Figure 6:
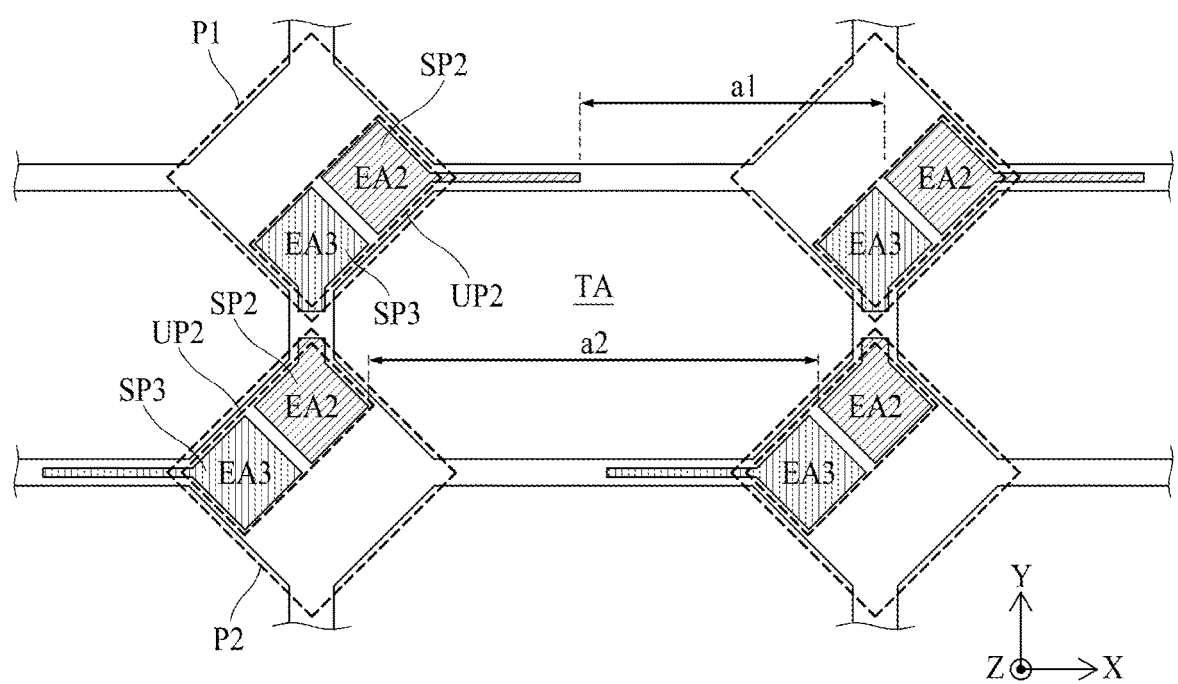
FIG. 6 is a view illustrating arrangement of subpixels included in a second unit pixel.

FIG. 3 is a schematic view illustrating an example of a pixel provided in an area A of FIG. 2, FIG. 4 is a schematic view illustrating a first signal line, a second signal line and a pixel, FIG. 5 is a view illustrating arrangement of subpixels included in a first unit pixel, and FIG. 6 is a view illustrating arrangement of subpixels included in a second unit pixel.

Referring to FIG. 3 and FIG. 6, a transparent display panel 110 may include a display area DA provided with pixels P to display an image, and a non-display area NDA for not displaying an image.

The display area DA includes a transmissive area TA and a non-transmissive area NTA. The transmissive area TA is an area through which most of externally incident light passes, and the non-transmissive area NTA is an area through which most of externally incident light fails to transmit. For example, the transmissive area TA may be an area where light transmittance is greater than α%, for example, about 90%, and the non-transmissive area NTA may be an area where light transmittance is smaller or less than β%, for example, about 50%. At this time, α is greater than β. A user may view an object or background arranged over a rear surface of the transparent display panel 110 due to the transmissive area TA.

A non-transmissive area may include first and second non-transmissive areas NTA1 and NTA2 in which a first signal line portion SL1 is disposed, third and fourth non-transmissive areas NTA3 and NTA4 in which a second signal line portion SL2 is disposed, and a pixel P.

The first signal line portion SL1 may be extended from the display area DA in a first direction (e.g., X-axis direction). The plurality of first signal line portions SL1 may be disposed to be spaced apart from each other.

For example, the first signal line portion SL1 may include a sensing scan line. As shown in FIG. 4, the first signal line portion SL1 may include first and second sensing scan lines SSL1 and SSL2. For example, the first sensing scan line SSL1 may provide a first sensing scan signal to one of a plurality of subpixels SP1 and SP3 included in a first unit pixel UP1 and a plurality of subpixels SP2 and SP3 included in a second unit pixel UP2. The second sensing scan line SSL2 may provide a second sensing scan signal to the other one of the plurality of subpixels SP1 and SP3 included in the first unit pixel UP1 and the other one of the plurality of subpixels SP2 and SP3 included in the second unit pixel UP2.

Hereinafter, when the first signal line portion SL1 includes a plurality of lines, one first signal line portion SL1 may refer to a signal line group including a plurality of lines. For example, when the first signal line portion SL1 includes first and second sensing scan lines SSL1 and SSL2, an initialization line, and a light emission control line, the first signal line portion SL1 may refer to a signal line group including first and second sensing scan lines SSL1 and SSL2, an initialization line, and a light emission control line.

The second signal line portion SL2 may be extended from the display area DA in a second direction (e.g., Y-axis direction), and may cross or overlap the first signal line portion SL1 in the display area DA. The plurality of second signal line portions SL2 may be disposed to be spaced apart from each other.

For example, the second signal line portion SL2 may include data lines. At this time, the second signal line portion SL2 may include two data lines as shown in FIG. 4. For example, the second signal line portion SL2 may include a first data line DL1 for supplying a first data voltage to a plurality of subpixels SP1 and SP3 included in the first unit pixel UP1, and a second data line DL2 for supplying a second data voltage to the plurality of subpixels SP2 and SP3 included in the second unit pixel UP2.

Although not shown in FIG. 4, the second signal line portion SL2 may further include at least one of a pixel power line, a common power line, or a reference line.

Hereinafter, when the second signal line portion SL2 includes a plurality of lines, one second signal line portion SL2 may refer to a signal line group including a plurality of lines. For example, when the second signal line portion SL2 includes the first and second data lines DL1 and DL2, the pixel power line, the common power line, and the reference line, one second signal line portion SL2 may refer to a signal line group including the first and second data lines DL1 and DL2, the pixel power line, the common power line, and the reference line.

The pixel power line may supply a first power source to a driving transistor of each of the subpixels SP1, SP2 and SP3 included in the display area DA. The common power line may supply a second power source to cathode electrodes of the subpixels SP1, SP2 and SP3 provided in the display area DA. At this time, the second power source may be a common power source commonly supplied to the subpixels SP1, SP2 and SP3. The reference line may supply an initialization voltage (or sensing voltage) to the driving transistor of each of the subpixels SP1, SP2 and SP3 included in the display area DA.

A transmissive area TA may be disposed between the first signal line portions SL1 adjacent to each other. In detail, the transmissive area TA may be disposed between a first non-transmissive area NTA1 in which a first signal line portion SL1-1 of an odd row is disposed and a second non-transmissive area NTA2 in which a first signal line portion SL1-2 of an even row is disposed. That is, the transmissive area TA may be disposed between the first signal line portion SL1-1 of the odd row and the first signal line portion SL1-2 of the even row.

Also, a transmissive area TA may be disposed between adjacent second signal line portions SL2. Specifically, the transmissive area TA may be disposed between the third non-transmissive area NTA3 in which the second signal line portion SL2-1 of the odd row is disposed and the fourth non-transmissive area NTA4 in which the second signal line portion SL2-2 of the even row is disposed. That is, the transmissive area TA may be disposed between the second signal line portion SL2-1 of the odd row and the second signal line portion SL2-2 of the even row. The transmissive area TA may be surrounded by two first signal line portions SL1-1 and SL1-2 and two second signal line portions SL2-1 and SL2-2.

The transmissive area TA may have a shape in which a length in the first direction is longer than that in the second direction. The first signal line portion SL1 extended in the first direction may have a width smaller or narrower than that of the second signal line portion SL2 extended in the second direction. The first signal line portion SL1 includes sensing scan lines SSL1 and SSL2, an initialization line, and a light emission control line, and the second signal line portion SL2 may include one of a pixel power line and a common power line in addition to the data lines DL1 and DL2. Since a high voltage is applied to the pixel power line and the common power line, the pixel power line and the common power line should have a width wider than that of the sensing scan lines SSL1 and SSL2, the initialization line, the light emission control line, or the data lines DL1 and DL2. Therefore, the second signal line portion SL2 may have a width wider than that of the first signal line portion SL1.

The transparent display panel 110 according to one embodiment of the present disclosure may improving transmittance by increasing a size of one transmissive area TA. When the size of one transmissive area TA is increased, a length of at least one of the first signal line portion SL1 or the second signal line portion SL2 surrounding one transmissive area TA may be increased.

When the transmissive area TA is formed to have a long length in the second direction, the length of the second signal line portion SL2 disposed between two adjacent transmissive areas TA may be increased. On the other hand, when the transmissive area TA is formed to have a long length in the second direction, the length of the first signal line portion SL1 disposed between two adjacent transmissive areas TA may be increased. The first signal line portion SL1 has a width smaller or narrower than that of the second signal line portion SL2. The area increase rate of the first signal line portion SL1 according to the length increase is smaller or less than that of the second signal line portion SL2. Since the area in which the first signal line portion SL1 and the second signal line portion SL2 are the non-transmissive area in which light is not transmitted, when the length of the transmissive area TA is increased in the first direction, an area increase rate of the non-transmissive area is smaller or less than the case that the length of the transmissive area TA is increased in the second direction.

Therefore, the transparent display panel 110 according to one embodiment of the present disclosure may increase the size of the transmissive area TA and improve transmittance by increasing the length of the transmissive area TA in the first direction.

The pixels P are provided in the intersection or overlapping area IA where the first signal line portion SL1 and the second signal line portion SL2 cross or overlap each other, and emit a predetermined light to display an image. The light emission area EA may correspond to an area in which light is emitted from the pixel P.

As shown in FIG. 3, the pixel P may include a first pixel P1 overlapped with at least a part of the first signal line portion SL1-1 of the odd row and a second pixel P2 overlapped with at least a part of the first signal line portion SL1-2 of the even row.

The first pixel P1 may be provided in an intersection or overlapping area where the first non-transmissive area NTA1 in which the first signal line portion SL1-1 of the odd row is disposed and the third non-transmissive area NTA3 in which the second signal line portion SL2-1 of the odd row is disposed cross or overlap each other. In addition, the first pixel P1 may be provided in an intersection or overlapping area where the first non-transmissive area NTA1 in which the first signal line portion SL1-1 of the odd row is disposed and the fourth non-transmissive area NTA4 in which the second signal line portion SL2-2 of the even row is disposed cross or overlap each other. Since the first pixel P1 overlapped with at least a part of the second signal line portion SL2-1 of the odd row is the same as the first pixel P1 overlapped with at least a part of the second signal line portion SL2-2 of the even row in the arrangement order of the subpixels SP1, SP2 and SP3, the first pixel P1 may be described as being disposed in the intersection or overlapping area where the first signal line portion SL1-1 of the odd row and the second signal line portion SL2 cross or overlap each other.

The second pixel P2 may be provided in an intersection or overlapping area where the second non-transmissive area NTA2 in which the first signal line portion SL1-2 of the even row is disposed and the third non-transmissive area NTA3 in which the second signal line portion SL2-1 of the odd row is disposed cross or overlap each other. In addition, the second pixel P2 may be provided in an intersection or overlapping area where the second non-transmissive area NTA2 in which the first signal line portion SL1-2 of the even row is disposed and the fourth non-transmissive area NTA4 in which the second signal line portion SL2-2 of the even row is disposed cross or overlap each other. Since the second pixel P2 overlapped with at least a part of the second signal line portion SL2-1 of the odd row is the same as the second pixel P2 overlapped with at least a part of the second signal line portion SL2-2 of the even row in the arrangement order of the subpixels SP1, SP2 and SP3, the second pixel P2 may be described as being disposed in the intersection or overlapping area where the first signal line portion SL1-2 of the even row and the second signal line portion SL2 cross or overlap each other.

Each of the first pixel P1 and the second pixel P2 may include a first unit pixel UP1 and a second unit pixel UP2. That is, the transparent display panel 110 according to one embodiment of the present disclosure may include two unit pixels UP1 and UP2 in the intersection or overlapping area IA where the first signal line portion SL1 and the second signal line portion SL2 cross or overlap each other.

The transparent display panel 110 according to one embodiment of the present disclosure includes two unit pixels UP1 and UP2 in one intersection or overlapping area to increase the size of the transmissive area TA, thereby improving transmittance and at the same time having high resolution.

Each of the first unit pixel UP1 and the second unit pixel UP2 may include at least two of the first subpixel SP1, the second subpixel SP2, and the third subpixel SP3. At this time, one of the first subpixel SP1, the second subpixel SP2, and the third subpixel SP3 may repeatedly be disposed in the first unit pixel UP1 and the second unit pixel UP2.

For example, the second subpixel SP2 may repeatedly be disposed in the first unit pixel UP1 and the second unit pixel UP2. That is, the first unit pixel UP1 includes a first subpixel SP1 and a third subpixel SP3, and the second unit pixel UP2 may include a second subpixel SP2 and a third subpixel SP3.

The first subpixel SP1 may include a first light emission area EA1 emitting light of a first color, and the second subpixel SP2 may include a second light emission area EA2 emitting light of a second color, and the third subpixel SP3 may include a third light emission area EA3 emitting light of a third color.

For example, the first to third light emission areas EA1, EA2 and EA3 may all emit light of different colors. For example, the first light emission area EA1 may emit green light, the second light emission area EA2 may emit blue light, and the third light emission area EA3 may emit red light, but the emission areas are not limited thereto. In addition, various modifications may be made in the arrangement order of the subpixels SP1, SP2 and SP3.

Hereinafter, for convenience of description, the description will be based on that the first subpixel SP1 is a green subpixel emitting green light, the second subpixel SP2 is a blue subpixel emitting blue light, and the third subpixel SP3 is a red subpixel emitting red light. In addition, the description will be based on that the first unit pixel UP1 includes a first subpixel SP1 and a third subpixel SP3 and the second unit pixel UP2 includes a second subpixel SP2 and a third subpixel SP3, but the unit pixels are not limited thereto.

The transparent display panel 110 according to one embodiment of the present disclosure is characterized in that the first pixel P1 and the second pixel P2 are different from each other in the arrangement order of the first to third subpixels SP1, SP2 and SP3. The first pixel P1 and the second pixel P2 may be different from each other in a position of at least one of the first subpixel SP1, the second subpixel SP2, or the third subpixel SP3.

In detail, the first pixel P1 and the second pixel P2 are different from each other in positions of the first unit pixel UP1 and the second unit pixel UP2. The first unit pixel UP1 of the first pixel P1 may be disposed in the first direction (e.g., direction D1) based on the intersection or overlapping area IA, and the second unit pixel UP2 of the first pixel P1 may be disposed in the second direction (e.g., direction D2) that is opposite to the first direction (e.g., direction D1). On the other hand, unlike the first pixel P1, the first unit pixel UP1 of the second pixel P2 may be disposed in the second direction (e.g., direction D2) based on the intersection or overlapping area IA, and the second unit pixel UP2 of the second pixel P2 may be disposed in the first direction (e.g., direction D1).

Meanwhile, the first subpixel SP1 and the third subpixel SP3 included in the first unit pixel UP1 may be different from each other in the arrangement order in the first pixel P1 and the second pixel P2. Therefore, the first subpixel SP1 and the third subpixel SP3 included in the first unit pixel UP1 may be different from each other in position and shape in the first pixel P1 and the second pixel P2.

In detail, four subpixel areas may be provided based on the intersection or overlapping area IA so that four subpixels may be disposed in each of the first pixel P1 and the second pixel P2. Each of the first pixel P1 and the second pixel P2 may include a first subpixel area overlapped with at least a part of the first signal line portion SL1, a second subpixel area overlapped with at least a part of the second signal line portion SL2, a third subpixel area overlapped with at least a part of the first signal line portion SL1, facing the first subpixel area, and a fourth subpixel area overlapped with at least a part of the second signal line portion SL2, facing the second subpixel area.

The first unit pixel UP1 of the first pixel P1 may be disposed in the first direction (e.g., direction D1) based on the intersection or overlapping area IA. The first subpixel SP1 included in the first unit pixel UP1 of the first pixel P1 may be disposed on the first signal line portion SL1-1 of the odd row. The first subpixel SP1 included in the first unit pixel UP1 of the first pixel P1 may be provided in the first subpixel area of the first pixel P1. In one embodiment, the first subpixel SP1 included in the first unit pixel UP1 of the first pixel P1 may include a protrusion protruded along the first signal line portion SL1-1 in a first side direction.

The third subpixel SP3 included in the first unit pixel UP1 of the first pixel P1 may be disposed on the second signal line portion SL2. The third subpixel SP3 included in the first unit pixel UP1 of the first pixel P1 may be provided in the second subpixel area of the first pixel P1. In one embodiment, the third subpixel SP3 included in the first unit pixel UP1 of the first pixel P1 may include a protrusion protruded along the second signal line portion SL2 in a second side direction.

Unlike the first pixel P1, the first unit pixel UP1 of the second pixel P2 may be disposed in the second direction (e.g., direction D2) based on the intersection or overlapping area IA. The first subpixel SP1 included in the first unit pixel UP1 of the second pixel P2 may be disposed on the first signal line portion SL1-2 of the even row. The first subpixel SP1 included in the first unit pixel UP1 of the second pixel P2 may be provided in the third subpixel area of the second pixel P2, unlike the first pixel P1. In one embodiment, the first subpixel SP1 included in the first unit pixel UP1 of the second pixel P2 may include a protrusion protruded along the first signal line portion SL1-2 in a third side direction opposite to a direction in which the first subpixel SP1 of the first pixel P1 is protruded.

The third subpixel SP3 included in the first unit pixel UP1 of the second pixel P2 may be disposed on the second signal line portion SL2. The third subpixel SP3 included in the first unit pixel UP1 of the second pixel P2 may be provided in the fourth subpixel area of the second pixel P2, unlike the first pixel P1. In one embodiment, the third subpixel SP3 included in the first unit pixel UP1 of the second pixel P2 may include a protrusion protruded along the second signal line portion SL2 in the second side direction.

When the first unit pixel UP1 of the first pixel P1 and the first unit pixel UP1 of the second pixel P2 have the arrangement order described as above, diagonal lengths c1 and c2 of the first subpixel SP1 of the first pixel P1 and the first subpixel SP1 of the second pixel P2 may be longer than a vertical length 'b' of the first subpixel SP1 of the first pixel P1 and the first subpixel SP1 of the second pixel P2, as shown in FIG. 5. In addition, the diagonal lengths c1 and c2 of the first subpixel SP1 of the first pixel P1 and the first subpixel SP1 of the second pixel P2 may be shorter than a horizontal length 'a' of the first subpixel SP1 of the first pixel P1 and the first subpixel SP1 of the second pixel P2.

When the first subpixel SP1 is a green subpixel, the green light may have luminance higher than that of each of the red light and the blue light. The transparent display panel 110 according to one embodiment of the present disclosure may embody optimal image quality by uniformly disposing green subpixels of high luminance.

The first pixel P1 and the second pixel P2 have the same position of the first unit pixel UP1 and the second unit pixel UP2, and may have the same arrangement order of the first subpixel SP1 and the third subpixel SP3 included in the first unit pixel UP1. Since the first subpixel SP1 is disposed at the same position in each of the first pixel P1 and the second pixel P2, the first subpixel SP1 may be disposed in a line to be parallel with the second signal line portion SL2 or the first signal line portion SL1. In this case, the green subpixels may be perceived from an image as a line. When the green subpixel has high luminance, a line comprised of green subpixels may be more easily perceived.

To avoid this, in the transparent display panel 110 according to one embodiment of the present disclosure, the first subpixel SP1 may be disposed at a different position in the first pixel P1 and the second pixel P2. The first pixel P1 may dispose the first subpixel SP1 in the first subpixel area, and the second pixel P2 may dispose the first subpixel SP1 in the third subpixel area provided at a position facing the first subpixel area, not the first subpixel area. Therefore, since the first subpixel SP1 is not disposed in a line to be parallel with the second signal line portion SL2, the first subpixel SP1 may not be perceived from an image as a line.

Meanwhile, the first subpixel SP1 of the first pixel P1 may include a protrusion protruded along the first signal line portion SL1-1 in the first side direction, and the first subpixel SP1 of the second pixel P2 may include a protrusion protruded along the first signal line portion SL1-2 in the third side direction opposite to the direction in which the first subpixel SP1 of the first pixel P1 is protruded.

In the transparent display panel 110 according to one embodiment of the present disclosure, each of the first subpixel SP1 of the first pixel P1 and the first subpixel SP1 of the second pixel P2 is protruded along the first signal line portion SL1, whereby the light emission area of the first subpixel SP1 may be increased and the size of the non-light emission area NEA. Therefore, the transparent display panel 110 according to one embodiment of the present disclosure can improve luminous efficiency.

In addition, in the transparent display panel 110 according to one embodiment of the present disclosure, the protrusions are provided in the first subpixel SP1 of the first pixel P1 and the first subpixel SP1 of the second pixel P2 in their respective directions different from each other, whereby the first subpixel SP1 may be more uniformly disposed.

The first pixel P1 and the second pixel P2 may be different from each other in arrangement orders of the second subpixel SP2 and the third subpixel SP3 included in the second unit pixel UP2 as well as the first unit pixel UP1. Therefore, the second subpixel SP2 and the third subpixel SP3 included in the second unit pixel UP2 may be different from each other in position and shape in the first pixel P1 and the second pixel P2.

In detail, the second unit pixel UP2 of the first pixel P1 may be disposed in the second direction (e.g., direction D2) based on the intersection or overlapping area IA. The second subpixel SP2 included in the second unit pixel UP2 of the first pixel P1 may be disposed on the first signal line portion SL1-1 of the odd row. The second subpixel SP2 included in the second unit pixel UP2 of the first pixel P1 may be provided in the third subpixel area of the first pixel P1. In one embodiment, the second subpixel SP2 included in the second unit pixel UP2 of the first pixel P1 may include a protrusion protruded along the first signal line portion SL1-1 in the third side direction opposite to the direction in which the first subpixel SP1 of the first unit pixel UP1 is protruded.

The third subpixel SP3 included in the second unit pixel UP2 of the first pixel P1 may be disposed on the second signal line portion SL2. The third subpixel SP3 included in the second unit pixel UP2 of the first pixel P1 may be provided in the fourth subpixel area of the first pixel P1. In one embodiment, the third subpixel SP3 included in the second unit pixel UP2 of the first pixel P1 may include a protrusion protruded along the second signal line portion SL2 in the second side direction opposite to the direction in which the third subpixel SP3 of the first unit pixel UP1 is protruded.

Unlike the first pixel P1, the second unit pixel UP2 of the second pixel P2 may be disposed in the first direction (e.g., direction D1) based on the intersection or overlapping area IA. Unlike the first pixel P1, the second subpixel SP2 included in the second unit pixel UP2 of the second pixel P2 may be disposed on the second signal line portion SL1-2 not the first signal line portion SL1. The second subpixel SP2 included in the second unit pixel UP2 of the second pixel P2 may be provided in the second subpixel area of the second pixel P2, unlike the first pixel P1. In one embodiment, the second subpixel SP2 included in the second unit pixel UP2 of the second pixel P2 may include a protrusion protruded along the second signal line portion SL2 in the second side direction.

The third subpixel SP3 included in the second unit pixel UP2 of the second pixel P2 may be disposed on the first signal line portion SL1-2 of the even row not the second signal line portion SL2, unlike the first pixel P1. The third subpixel SP3 included in the second unit pixel UP2 of the second pixel P2 may be provided in the first subpixel area of the second pixel P2, unlike the first pixel P1. In one embodiment, the third subpixel SP3 included in the second unit pixel UP2 of the second pixel P2 may include a protrusion protruded along the first signal line portion SL1-2 of the even row in the first side direction. The third subpixel SP3 included in the second unit pixel UP2 of the second pixel P2 may be disposed to be parallel with the first subpixel SP1 of the first unit pixel UP1 of the first pixel P1.

When the second unit pixel UP2 of the first pixel P1 and the second unit pixel UP2 of the second pixel P2 have the arrangement order described as above, a horizontal length 'a1' between two adjacent second subpixels SP2 of the first pixel P1 may be different from a horizontal length 'a2' between two adjacent second subpixels SP2 of the second pixel P2. In detail, the horizontal length 'a1' between two adjacent second subpixels SP2 of the first pixel P1 may be longer than the horizontal length 'a2' between two adjacent second subpixels SP2 of the second pixel P2 as shown in FIG. 6.

Each of the first pixel P1 and the second pixel P2 may include two third subpixels SP3. The two third subpixels SP3 of the first pixel P1 may be disposed to face each other along the second signal line portion SL2. One of the two third subpixels SP3 of the second pixel P2 may be disposed on the first signal line portion SL1, and the other one may be disposed on the second signal line portion SL2. In the transparent display panel 110 according to one embodiment of the present disclosure, the third subpixel SP3 is disposed differently in the first pixel P1 and the second pixel P2, whereby the third subpixel SP3 may be prevented from being perceived from an image as a line.

The two third subpixels SP3 may be disposed to face each other along the second signal line portion SL2 in both the first pixel P1 and the second pixel P2. In this case, since the third subpixels SP3 are disposed in a line along the second signal line portion SL2, the third subpixels SP3 may be perceived from the image as a line. Since the second signal line portions SL2 are spaced apart from each other with a distance greater than the first signal line portions SL1, a line comprised of the third subpixels SP3 may be more easily perceived.

In the transparent display panel 110 according to one embodiment of the present disclosure, the third subpixels SP3 are disposed differently in the first pixel P1 and the second pixel P2, whereby the third subpixel SP3 may be prevented from being disposed in a line along the second signal line portion SL2. Therefore, the transparent display panel 110 according to one embodiment of the present disclosure may prevent the third subpixel SP3 from being perceived from an image as a line.

As described above, in the transparent display panel 110 according to one embodiment of the present disclosure, the subpixels SP1, SP2 and SP3 provided in each of the first pixel P1 provided over the first signal line portion SL1-1 of the odd row and the second pixel P2 provided over the first signal line portion SL1-2 of the even row may be disposed differently. The transparent display panel 110 provided with the first pixel P1 and the second pixel P2 may have high transmittance and at the same time have high resolution, and furthermore, may provide optimal image quality.

Meanwhile, in the transparent display panel 110 according to one embodiment of the present disclosure, the pixel P includes a plurality of sides facing the transmissive area TA, and each of the plurality of sides of the pixel P has an inclination with respect to each of the first signal line portion SL1 and the second signal line portion SL2.

In detail, the pixel P may include first and second sides S1 and S2 facing the transmissive area TA, a third side S3 facing the first side S1, and a fourth side S4 facing the second side S2. For example, the pixel P may have a protrusion protruded along the first signal line portion SL1 in a rhombus shape comprised of four sides S1, S2, S3 and S4. In this case, the transmissive area TA may have a hexagonal shape or an octagonal shape depending on the size and arrangement of the pixel P.

Each of the first side S1, the second side S2, the third side S3 and the fourth side S4 of the pixel P may have an inclination that is not parallel with or perpendicular to the first signal line portion SL1. That is, each of the first side S1, the second side S2, the third side S3 and the fourth side S4 of the pixel P may have an inclination greater than 0 and less than 90 with respect to the first signal line portion SL1. For example, each of the first side S1, the second side S2, the third side S3, and the fourth side S4 of the pixel P may be an oblique line having an inclination greater than 30 and less than 60 with respect to the first signal line portion SL1.

In addition, each of the first side S1, the second side S2, the third side S3, and the fourth side S4 of the pixel P may have an inclination not parallel to or perpendicular to the second signal line portion SL2. That is, each of the first side S1, the second side S2, the third side S3, and the fourth side S4 of the pixel P may have an inclination greater than 0 and smaller or less than 90 with respect to the second signal line portion SL2. For example, each of the first side S1, the second side S2, the third side S3 and the fourth side S4 of the pixel P may be an oblique line having an inclination greater than 30 and smaller or less than 60 with respect to the second signal line portion SL2.

Meanwhile, the non-transmissive area may be categorized into a light emission area EA that is provided with the pixel P to emit light and a non-light emission area NEA that does not emit light.

The light emission area EA may be provided with a plurality of subpixels SP1, SP2 and SP3 to emit light of a predetermined color, and may include a first light emission area EA1, a second light emission area EA2, and a third light emission area EA3, which are respectively provided the subpixels SP1, SP2 and SP3.

A black matrix BM may be provided in the non-light emission area NEA. The black matrix BM may include a first black matrix BM1, a second black matrix BM2, a third black matrix BM3, and a fourth black matrix BM4.

The first black matrix BM1 may be disposed among the plurality of subpixels SP1, SP2 and SP3 to prevent a color mixture from occurring among the plurality of subpixels SP1, SP2 and SP3.

The second black matrix BM2 is provided between each of the plurality of subpixels SP1, SP2 and SP3 and the transmissive area TA to prevent light generated from each of the plurality of subpixels SP1, SP2 and SP3 from being seen as light of another color depending on a viewing angle.

The third black matrix BM3 may be disposed between the pixels P disposed to be adjacent to each other in the first direction to prevent a color mixture from occurring between the pixels P disposed adjacent to each other in the first direction and prevent externally incident light from being reflected from the first signal line portion SL1.

The fourth black matrix BM4 may be disposed between the pixels P disposed to be adjacent to each other in the second direction to prevent a color mixture from occurring between the pixels P disposed to be adjacent to each other in the second direction and prevent the externally incident light from being reflected from the second signal line portion SL2.

Since the black matrix BM is formed of a material that shields or absorbs light, the light generated from the subpixels SP1, SP2, and SP3 may not transmit the area where the black matrix BM is formed, and the externally incident light may not transmit the area either. Therefore, the area in which the black matrix BM is formed corresponds to the non-light emission area NEA from which light is not emitted.

Since the black matrix BM shields or absorbs light, it may significantly affect transmittance of the transparent display panel 110. In detail, transmittance of the transparent display panel 110 may be reduced as the area where the black matrix BM is formed, that is, the non-light emission area NEA is increased. On the other hand, transmittance of the transparent display panel 110 may be increased as the non-light emission area NEA is reduced.

The transparent display panel 110 according to one embodiment of the present disclosure has a pixel P structure for reducing the area where the black matrix BM is formed, that is, the non-light emission area NEA. In the transparent display panel 110 according to one embodiment of the present disclosure, the pixel P is provided in the intersection or overlapping area IA where the first signal line portion SL1 and the second signal line portion SL2 cross or overlap each other, and each of the plurality of sides S1, S2, S3 and S4 of the pixel P has an inclination with respect to each of the first signal line portion SL1 and the second signal line portion SL2. The transparent display panel 110 having such a pixel P may more reduce an outer length of the transmissive area TA than the transparent display panel having a pixel Pin which a plurality of sides S1, S2, S3 and S4 are parallel with or perpendicular to the first signal line portion SL1 and the second signal line portion SL2.

That is, the transparent display panel 110 according to one embodiment of the present disclosure may reduce a total area of the second black matrix BM2 provided between each of the plurality of subpixels SP1, SP2 and SP3 and the transmissive area TA, the third black matrix BM3 provided between the pixels P disposed to be adjacent to each other in the first direction and the fourth black matrix BM4 provided between the pixels P disposed to be adjacent to each other in the second direction. Therefore, the transparent display panel 110 according to one embodiment of the present disclosure may improve transmittance as the area where the black matrix BM is formed, that is, the non-light emission area NEA is reduced.

In addition, in the transparent display panel 110 according to one embodiment of the present disclosure, one pixel P is provided in the intersection or overlapping area IA where the first signal line portion SL1 and the second signal line portion SL2 cross or overlap each other, and includes a plurality of subpixels SP1, SP2 and SP3 disposed based on the intersection or overlapping area IA. The transparent display panel 110 according to one embodiment of the present disclosure may improve definition in image quality and readability by collectively disposing the plurality of subpixels SP1, SP2 and SP3 based on the intersection or overlapping area IA.

In the transparent display panel 110 according to one embodiment of the present disclosure, the first non-emission area NEA1 provided among the plurality of subpixels SP1, SP2 and SP3 may have an inclination with respect to each of the first signal line portion SL1 and the second signal line portion SL2. For example, the black matrix BM may be provided from the intersection or overlapping area IA to an intermediate point of each of the sides S1, S2, S3 and S4 of the pixel P. In this way, the transparent display panel 110 provided with the black matrix BM may more reduce the first non-emission area NEA1 than the transparent display panel in which the black matrix BM is provided among the plurality of subpixels SP1, SP2 and SP3 along the first signal line portion SL1 or the second signal line portion SL2.

That is, the transparent display panel 110 according to one embodiment of the present disclosure may reduce the area of the first black matrix BM1 provided among the plurality of subpixels SP1, SP2 and SP3. Therefore, the transparent display panel 110 according to one embodiment of the present disclosure may improve transmittance as the area where the black matrix BM is formed, that is, the non-light emission area NEA is reduced.

Meanwhile, the transparent display panel 110 according to one embodiment of the present disclosure may be driven in a double speed driving (DRD) method. In detail, in the transparent display panel 110 according to one embodiment of the present disclosure, the subpixels provided in one unit pixel may share one data line, and may be connected to two sensing scan lines. Therefore, the transparent display panel 110 according to one embodiment of the present disclosure may time-divisionally supply a data voltage to adjacent subpixels connected to one data line. As described above, the transparent display panel 110 according to one embodiment of the present disclosure may be driven in the DRD method to reduce the number of data lines, thereby reducing an area for forming the second signal line portion SL2.

However, the DRD method may reduce the number of data lines to ½ but may increase the number of scan lines twice. For this reason, in the transparent display panel 110 driven in the DRD method, the size of the area where the second signal line portion SL2 is formed is reduced, but the size of the area where the first signal line portion SL1 is formed is increased.

The present disclosure is intended to provide a transparent display panel 110 capable of minimizing an area for forming the first signal line portion SL1 in a DRD driving method.

Hereinafter, a gate driver 205 and the first signal line portion for receiving a signal from the gate driver 205 will be described in more detail with reference to FIGS. 7 to 13.

Figure 7:
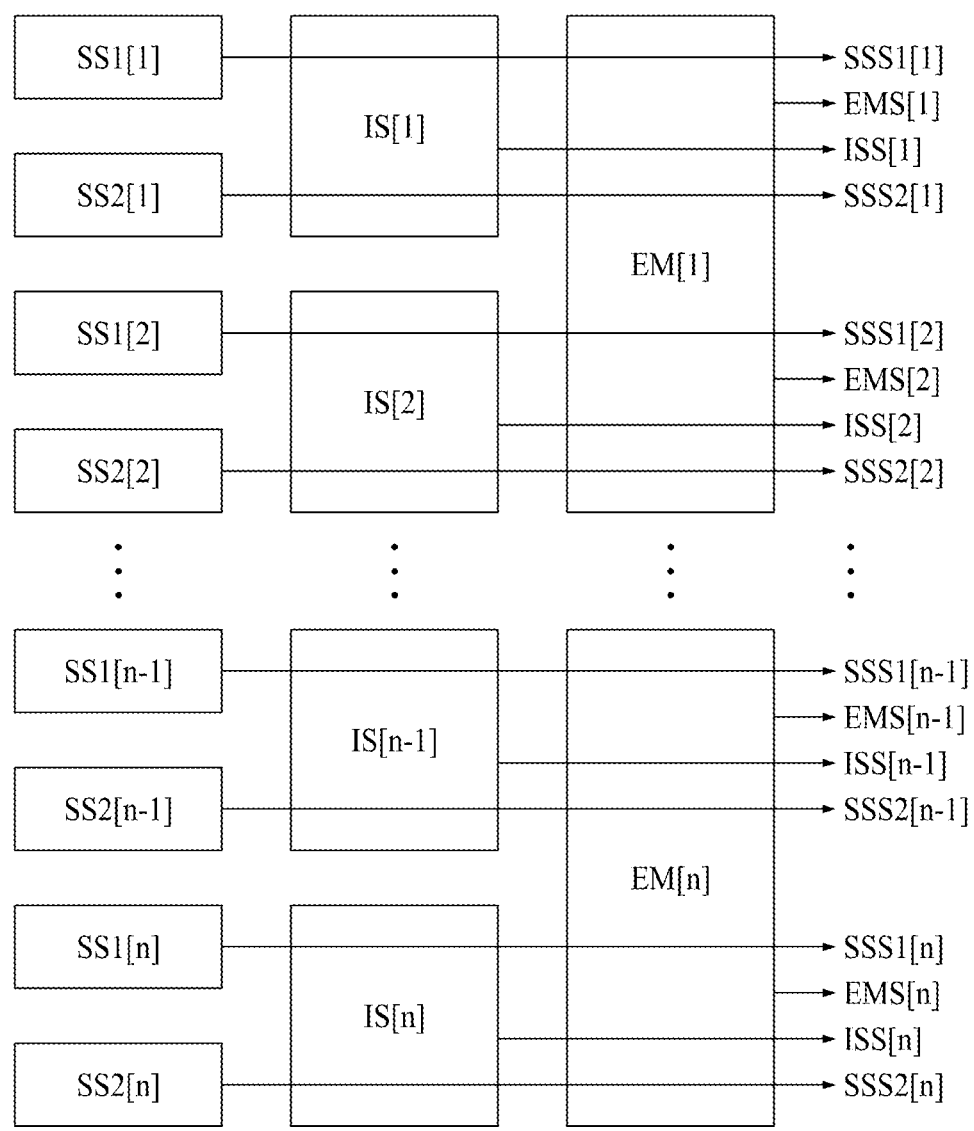
FIG. 7 is a schematic view illustrating a structure of a gate driver according to one embodiment of the present disclosure.

FIG. 7 is a schematic view illustrating a structure of a gate driver according to one embodiment of the present disclosure.

Referring to FIG. 7, the gate driver 205 sequentially supplies a sensing scan signal to a plurality of sensing scan lines to sequentially drive the plurality of sensing scan lines.

The gate driver 205 may include first sensing signal generators SS1[1], SS1[2], . . . , SS1[$n$−1] and SS1[$n$], second sensing signal generators SS2[1], SS2[2], . . . , SS2[$n$−1] and SS2[$n$], initialization signal generators IS[1], IS[2], . . . , IS[n−1] and IS[n], and light emission control signal generators EM[1], EM[2], . . . , EM[n−1] and EM[n].

The first sensing signal generators SS1[1], SS1[2], . . . , SS1[$n$−1] and SS1[$n$] may be circuits for generating first sensing scan signals SSS1[1], SSS1[2], . . . , SSS1[$n$−1] and SSS1[$n$] used to turn on or turn off switching transistors included in the subpixels SP1, SP2 and SP3. The first sensing signal generators SS1[1], SS1[2], . . . , SS1[$n$−1] and SS1[$n$] may supply the first sensing scan signals SSS1[1], SSS1[2], . . . , SSS1[$n$−1] and SSS1[$n$] through a first sensing scan line SSL1.

The second sensing signal generators SS2[1], SS2[2], . . . , SS2[$n$−1] and SS2[$n$] may be circuits for generating second sensing scan signals SSS2[1], SSS2[2], . . . , SSS2[$n$−1] and SSS2[$n$] used to turn on or turn off the switching transistors included in the subpixels SP1, SP2 and SP3. The second sensing signal generators SS2[1], SS2[2], . . . , SS2[$n$−1] and SS2[$n$] may supply the second sensing scan signals SSS2[1], SSS2[2], . . . , SSS2[$n$−1] and SSS2[$n$] through a second sensing scan line SSL2.

The first sensing signal generators SS1[1], SS1[2], . . . , SS1[$n$−1] and SS1[$n$] and the second sensing signal generators SS2[1], SS2[2], . . . , SS2[$n$−1] and SS2[$n$] may be provided in one horizontal line, and may sequentially be driven.

The initialization signal generators IS[1], IS[2], . . . , IS[n−1] and IS[n] may be circuits for generating initialization signals ISS[1], ISS[2], . . . , ISS[n−1] and ISS[n] used to turn on or turn off initial switching transistors. The initialization signal generators IS[1], IS[2], . . . , IS[n−1] and IS[n] may supply the initialization signals ISS[1], ISS[2], . . . , ISS[n−1] and ISS[n] through an initialization line IL.

The light emission control signal generators EM[1], EM[2], . . . , EM[n−1] and EM[n] may be circuits for generating light emission control signals EM[1], EM[2], . . . , EM[n−1] and EM[n] used to turn on or turn off light emission control transistors included in the subpixels SP1, SP2 and SP3. The light emission control signal generators EM[1], EM[2], . . . , EM[n−1] and EM[n] may supply the light emission control signals EM[1], EM[2], . . . , EM[n−1] and EM[n] through a light emission control line EML.

In one embodiment, the light emission control signal generators EM[1], EM[2], . . . , EM[n−1] and EM[n] may be shared by two horizontal lines as shown in FIG. 7, but are not limited thereto. In another embodiment, the light emission control signal generators EM[1], EM[2], . . . , EM[n−1] and EM[n] may be shared by four horizontal lines.

The transparent display panel 110 including the gate driver 205 as described above may include two sensing scan lines SSL1 and SSL2, an initialization line IL, and a light emission control line EML in one horizontal line. The transparent display panel 110 according to one embodiment of the present disclosure may allow subpixels connected to the first sensing scan line SSL1 and subpixels connected to the second sensing scan line SSL2 to share the initialization line IL and the light emission control line EML. Therefore, the transparent display panel 110 according to one embodiment of the present disclosure may reduce each of the number of initialization lines IL and the number of light emission control lines EML.

Figure 8:
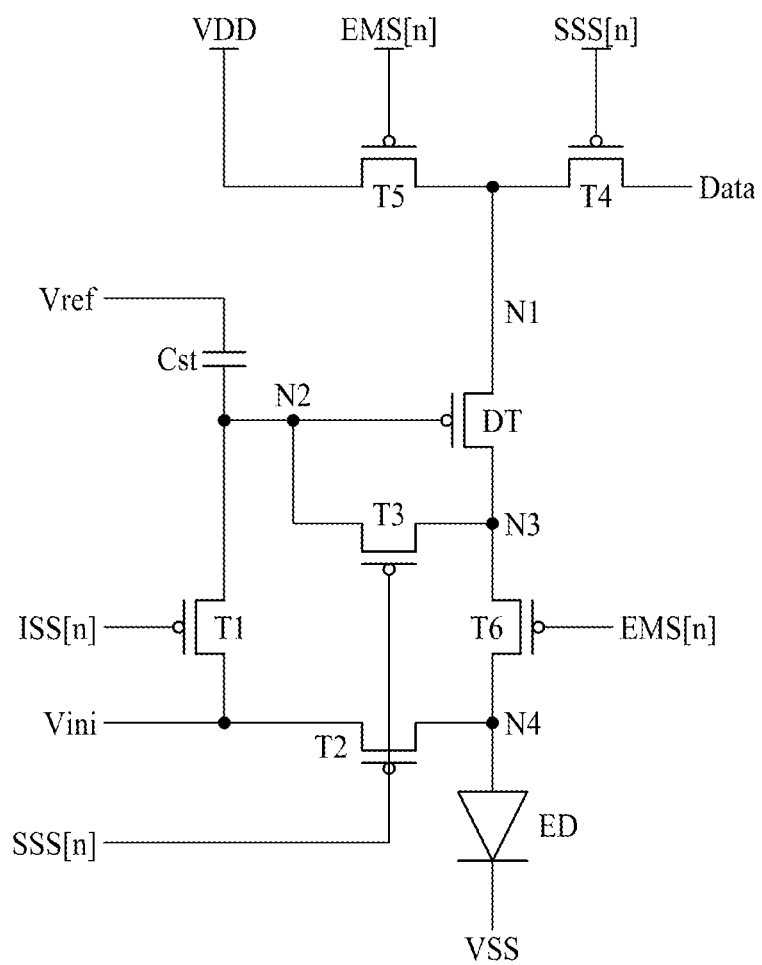
FIG. 8 is a circuit view illustrating an example of a circuit area.
Figure 9:
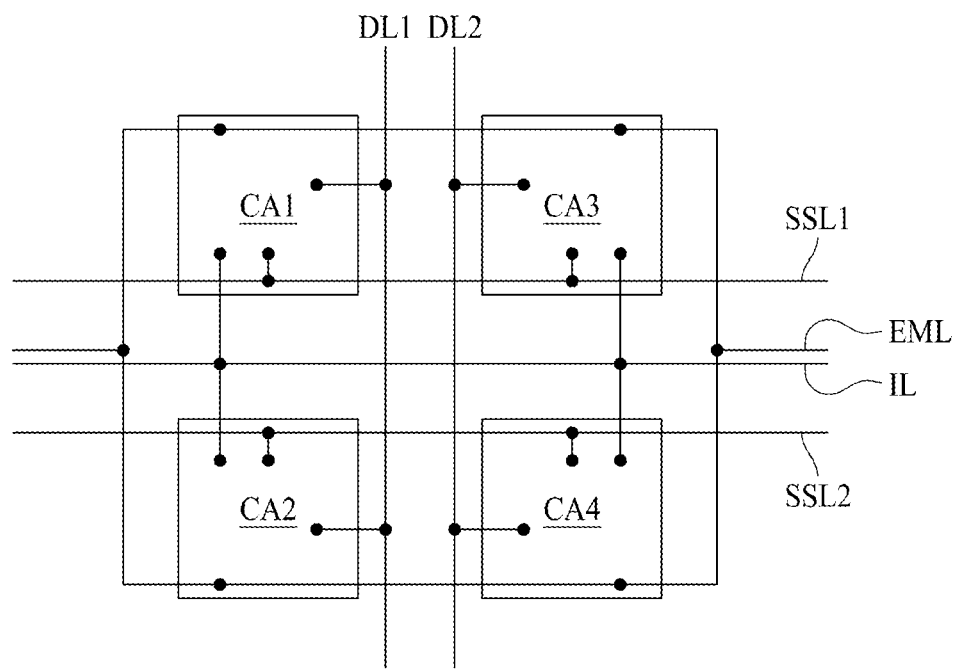
FIG. 9 is a view illustrating a connection relation between a plurality of circuit areas and a plurality of lines.
Figure 10:
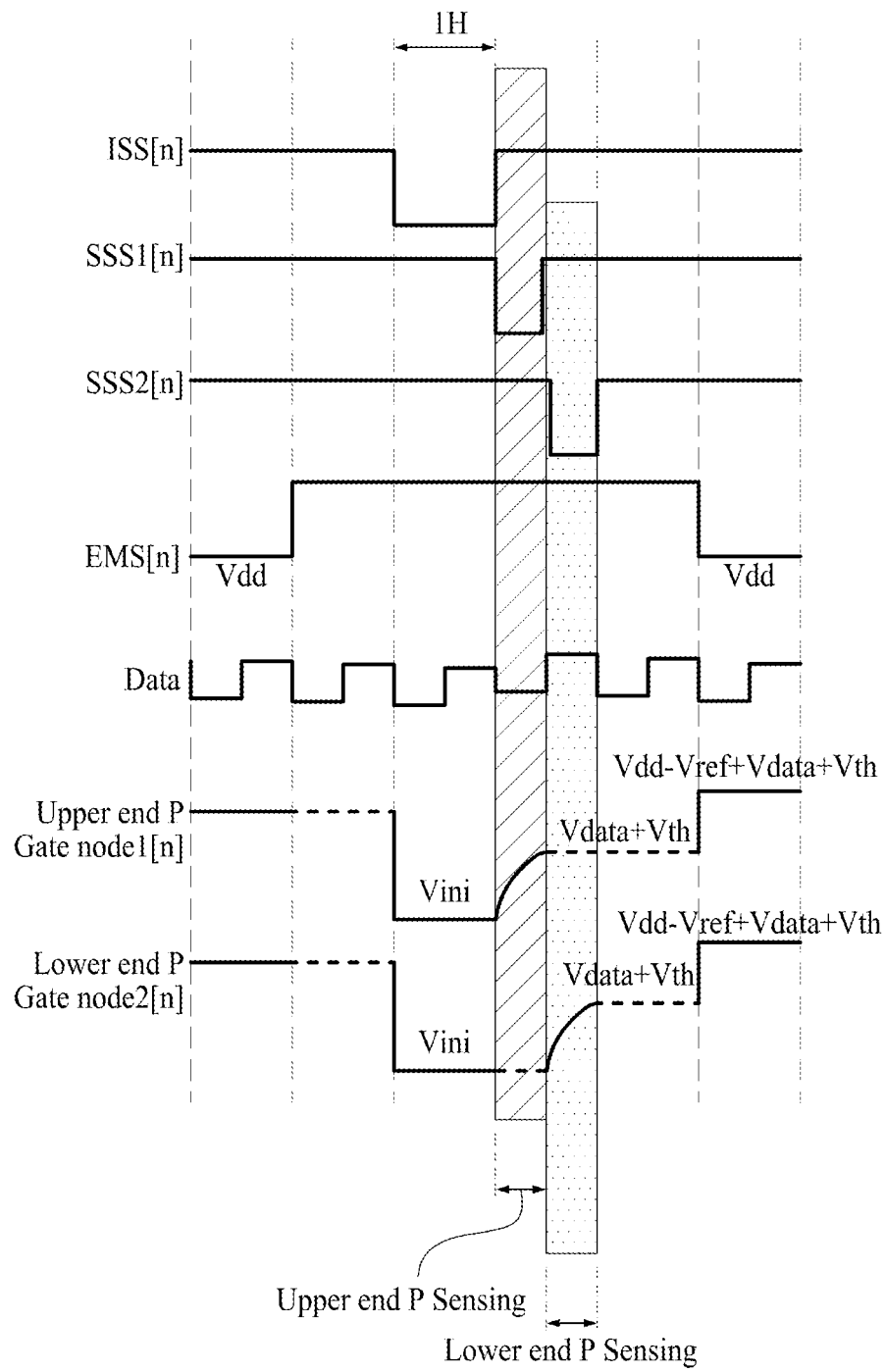
FIG. 10 is a view illustrating an example of an operation timing of a circuit area of FIGS. 8 and 9.
Figure 11:
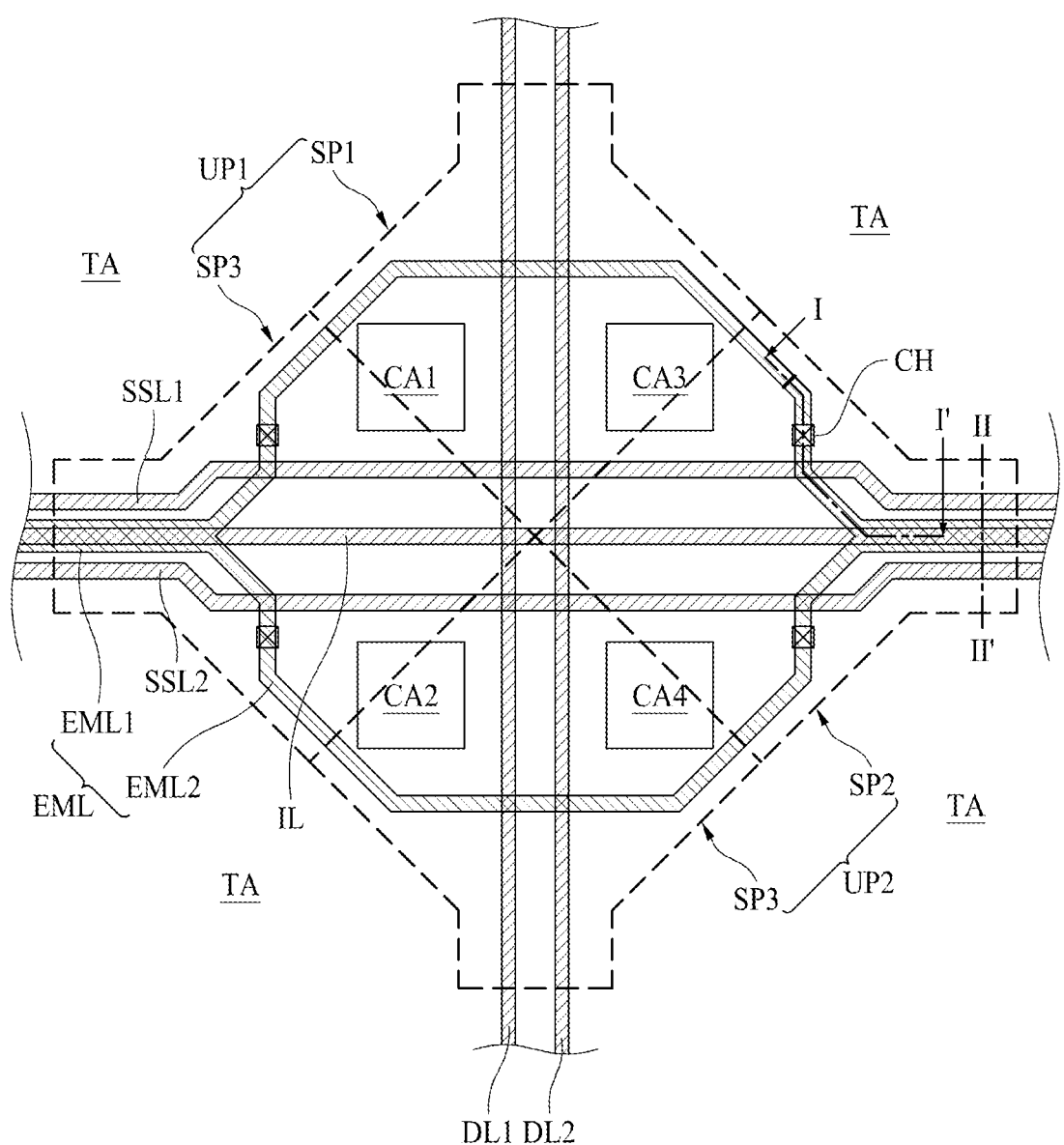
FIG. 11 is a plane view illustrating an example of a plurality of lines and a plurality of circuit areas disposed in a pixel area.
Figure 12:
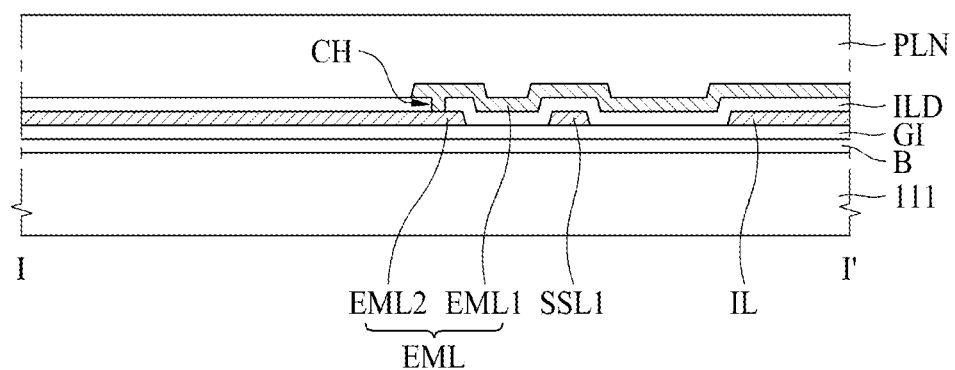
FIG. 12 is a cross-sectional view taken along line I-I' of FIG. 11.
Figure 13:
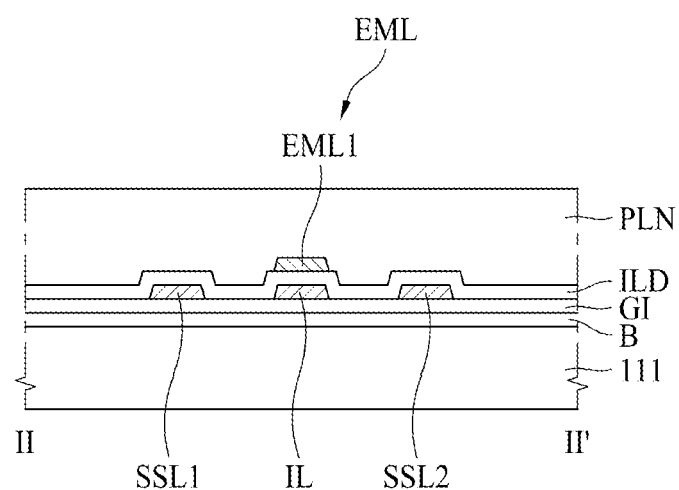
FIG. 13 is a cross-sectional view taken along line II-II' of FIG. 11.

FIG. 8 is a circuit view illustrating an example of a circuit area, FIG. 9 is a view illustrating a connection relationship between a plurality of circuit areas and a plurality of lines, and FIG. 10 is a view illustrating an example of an operation timing of the circuit area of FIGS. 8 and 9. FIG. 11 is a plan view illustrating an example of a plurality of lines and a plurality of circuit areas disposed in a pixel area. FIG. 12 is a cross-sectional view illustrating an example taken along line I-I' of FIG. 11, and FIG. 13 is a cross-sectional view illustrating an example taken along line II-II' of FIG. 11.

Referring to FIGS. 8 to 13, the transparent display panel 110 according to one embodiment of the present disclosure may include pixels P in the intersection or overlapping area IA where the first signal line portion SL1 and the second signal line portion SL2 cross or overlap each other.

The pixels P may include a first unit pixel UP1 and a second unit pixel UP2. That is, the transparent display panel 110 according to one embodiment of the present disclosure may include two unit pixels UP1 and UP2 in the intersection or overlapping area IA where the first signal line portion SL1 and the second signal line portion SL2 cross or overlap each other.

Each of the first unit pixel UP1 and the second unit pixel UP2 may include at least two of a first subpixel SP1, a second subpixel SP2, or a third subpixel SP3. At this time, one of the first subpixel SP1, the second subpixel SP2, and the third subpixel SP3 may repeatedly be disposed in the first unit pixel UP1 and the second unit pixel UP2.

For convenience of description, the first unit pixel UP1 includes a first subpixel SP1 and a third subpixel SP3, and the second unit pixel UP2 includes a second subpixel SP2 and a third subpixel SP3, but the unit pixels are not limited thereto.

Meanwhile, the transparent display panel 110 according to one embodiment of the present disclosure may include a plurality of circuit areas CA based on the intersection or overlapping area IA where the first signal line portion SL1 and the second signal line portion SL2 cross or overlap each other. The plurality of circuit areas CA may correspond to the subpixels. For example, when the pixel P provided in the intersection or overlapping area IA includes four subpixels, four circuit areas CA respectively corresponding to the four subpixels may be disposed based on the intersection or overlapping area IA as shown in FIG. 11.

The plurality of circuit areas CA may include a first circuit area CA1 corresponding to the first subpixel SP1 of the first unit pixel UP1, a second circuit area CA2 corresponding to the third subpixel SP3 of the first unit pixel UP1, a third circuit area CA3 corresponding to the second subpixel SP2 of the second unit pixel UP2, and a fourth circuit area CA4 corresponding to the third subpixel SP3 of the second unit pixel UP2.

Each of the first to fourth circuit areas CA1 to CA4 may include a plurality of switching transistors T1 to T6, a driving transistor DT, a capacitor Cst, and a light emitting diode ED, as shown in FIG. 8.

A gate electrode of the first transistor T1 may be connected to the initialization line IL, and its first electrode may be connected to an initialization voltage line Vini. Also, a second electrode of the first transistor T1 may be connected to one end of the capacitor Cst, a second electrode of the third transistor T3, and a gate electrode of the driving transistor DT.

The first transistor T1 may be turned on in response to an initial scan signal of a low level, which is applied through the initialization line IL. When the first transistor T1 is turned on, a gate node N2 of the driving transistor DT may be initialized based on the initialization voltage Vini.

A gate electrode of the second transistor T2 may be connected to the (n)th sensing scan line SSL(n), and its first electrode may be connected to an anode electrode of the light emitting diode ED. Also, a second electrode of the second transistor T2 may be connected to the initialization voltage line Vini.

The second transistor T2 may be turned on in response to a scan signal SCAN(n) of a low level, which is applied through the (n)th sensing scan line SSL(n). When the second transistor T2 is turned on, the light emitting diode ED may be initialized based on the initialization voltage Vini.

A gate electrode of the third transistor T3 may be connected to the (n)th sensing scan line SSL(n), and its first electrode may be connected to a first electrode of the driving transistor DT. Also, a second electrode of the third transistor T3 may be connected to the gate electrode of the driving transistor DT.

The third transistor T3 may be turned on in response to the scan signal SCAN[n] of a low level, which is applied through the (n)th sensing scan line SSL[n]. When the third transistor T3 is turned on, the driving transistor DT may be a diode connection state.

A gate electrode of the fourth transistor T4 may be connected to the (n)th sensing scan line SSL[n] and its first electrode may be connected to a second electrode of the fifth transistor T5 and a source node N1 of the driving transistor DT. Also, a second electrode of the fourth transistor T4 may be connected to a data line DL.

The fourth transistor T4 may be turned on in response to the scan signal SCAN[n] of a low level, which is applied through the (n)th sensing scan line SSL[n]. When the fourth transistor T4 is turned on, a data voltage Data applied through the data line DL may be charged in the second electrode of the fourth transistor T4.

A gate electrode of the fifth transistor T5 may be connected to an (n)th light emission control line EML[n] and its first electrode may be connected to the pixel power line VDDL. Also, a second electrode of the fifth transistor T5 may be connected to the first electrode of the fourth transistor T4.

The fifth transistor T5 may be turned on in response to a light emission control signal EM[n] of a low level, which is applied through the (n)th light emission control line EML[n]. When the fifth transistor T5 is turned on, the data voltage Data charged in the second electrode of the fourth transistor T4 may be transferred to the other end of the capacitor Cst.

A gate electrode of the sixth transistor T6 may be connected to the (n)th light emission control line EML[n] and its first electrode may be connected to the first electrode of the driving transistor DT. Also, a second electrode of the sixth transistor T6 may be connected to the anode electrode of the light emitting diode ED.

The sixth transistor T6 may be turned on in response to the light emission control signal EM[n] of a low level, which is applied through the (n)th light emission control line EML[n]. When the sixth transistor T6 is turned on, the light emitting diode ED may emit light in response to a driving current generated through the driving transistor DT.

One end of the capacitor Cst may be connected to the second electrode of the first transistor T1, and its other end may be connected to a reference line VREF. An anode electrode of an organic light emitting diode OLED may be connected to the second electrode of the sixth transistor T6, and its cathode electrode may be connected to a common power electrode VSS.

As described above, the plurality of circuit areas CA may be connected to the first signal line portion SL1 and the second signal line portion SL2 to receive a signal. In detail, the first signal line portion SL1 may include a first sensing scan line SSL1, a second sensing scan line SS2, an initialization line IL, and a light emission control line EML. The second signal line portion SL2 may include a first data line DL1 and a second data line DL2.

As shown in FIG. 9, the first data line DL1 may be connected to each of the first circuit area CA1 and the second circuit area CA2 to provide a first data voltage. That is, the first data line DL1 may provide the first data voltage to the subpixels SP1 and SP3 included in the first unit pixel UP1.

The second data line DL2 may be connected to each of the third circuit area CA3 and the fourth circuit area CA4 to provide a second data voltage. That is, the second data line DL2 may provide the second data voltage to the subpixels SP2 and SP3 included in the second unit pixel UP2.

The initialization line IL may be connected to each of the first to fourth circuit areas CA1, CA2, CA3, and CA4 to provide an initial scan signal. When the initial switching transistor is turned on by the initial scan signal, the gate node of the driving transistor may be initialized based on the initialization voltage Vinif.

The first sensing scan line SSL1 may be connected to the first circuit area CA1 and the third circuit area CA3 to provide a first sensing scan signal Scan(n). That is, the first sensing scan line SSL1 may provide the first sensing scan signal Scan(n) to one of the subpixels SP1 and SP3 included in the first unit pixel UP1 and one of the subpixels SP2 and SP3 included in the second unit pixel UP2.

The second sensing scan line SSL2 may be connected to the second circuit area CA2 and the fourth circuit area CA4 to provide a second sensing scan signal Scan(n+1). That is, the second sensing scan line SSL2 may provide the second sensing scan signal Scan(n+1) to the other of the subpixels SP1 and SP3 included in the first unit pixel UP1 and the other one of the subpixels SP2 and SP3 included in the second unit pixel UP2.

As a result, the subpixels SP1 and SP3 included in the first unit pixel UP1 may share one first data line DL1. One of the subpixels SP1 and SP3 included in the first unit pixel UP1, for example, the first subpixel SP1 may be connected to the first sensing scan line SSL1, and the other one, for example, the third subpixel SP3 may be connected to the second sensing scan line SSL2.

When the first sensing scan signal Scan(n) is input to the first sensing scan line SSL1, the first data voltage input to the first data line DL1 may be charged in the gate node N of the first subpixel SP1 of the first unit pixel UP1. When the second sensing scan signal Scan(n+1) is input to the second sensing scan line SSL2 after 0.5 horizontal period (0.5H), the first data voltage input to the first data line DL1 may be charged in the gate node Gate node(n+1) of the third subpixel SP3 of the first unit pixel UP1. In this way, the subpixels SP1 and SP3 of the first unit pixel UP1 may share the first data line DL1, and thus may be driven in the DRD.

The subpixels SP2 and SP3 included in the second unit pixel UP2 may share one second data line DL2. In addition, one of the subpixels SP2 and SP3 included in the second unit pixel UP2, for example, the second subpixel SP2 may be connected to the first sensing scan line SSL1, and the other, for example, the third subpixel SP3 may be connected to the second sensing scan line SSL2.

When the first sensing scan signal Scan(n) is input to the first sensing scan line SSL1, the second data voltage input to the second data line DL2 may be charged in the gate node Gate node(n) of the second subpixel SP2 of the second unit pixel UP2. When the second sensing scan signal is input to the second sensing scan line SSL2 after 0.5 horizontal period (0.5H), the second data voltage input to the second data line DL2 may be charged in the gate node Gate node(n+1) of the third subpixel SP3 of the second unit pixel UP2. In this way, the subpixels SP2 and SP3 of the second unit pixel UP2 may share the second data line DL2, and thus may be driven in the DRD.

The light emission control line EML may be connected to each of the first to fourth circuit areas CA1, CA2, CA3 and CA4 to provide the light emission control signal EM. When the light emission control transistor is turned on by the light emission control signal EM, a pixel power voltage Vdd may be applied to the pixel power line. Therefore, a data current determined based on the gate node of the driving transistor and the pixel power voltage Vdd may be supplied to the anode electrode of the light emitting diode. A common power voltage applied to the common power line may be supplied to the cathode electrode of the light emitting diode.

In the transparent display panel 110 according to one embodiment of the present disclosure, the first sensing scan line SSL1, the second sensing scan line SSL2, the initialization line IL and the light emission control line EML may be extended along the first direction. At this time, the transparent display panel 110 according to one embodiment of the present disclosure is characterized in that the light emission control line EML overlaps the initialization line IL in at least a partial area.

In detail, the light emission control line EML may include a straight line portion and a divergence portion diverged from the straight line portion.

The straight line portion of the light emission control line EML may be provided between pixels P disposed to be adjacent to each other along the first direction. The divergence portion of the light emission control line EML may be diverged from the straight line portion and connected to each of the plurality of circuit areas CAL CA2, CA3 and CA4 to provide a signal. At this time, the divergence portion of the light emission control line EML may be provided to surround the plurality of circuit areas CAL CA2, CA3 and CA4.

The light emission control line EML may be extended in a straight line between adjacent pixels P, diverged and joined again in the pixel P to surround the plurality of circuit areas CAL CA2, CA3 and CA4. On the other hand, the initialization line IL may cross or overlap the plurality of circuit areas CAL CA2, CA3 and CA4 in the pixel P as well as between the adjacent pixels P in a straight line. Therefore, the light emission control line EML may overlap the initialization line IL in the straight line portion, and may not overlap the initialization line IL in the divergence portion.

The light emission control line EML may include a plurality of lines instead of one line. In detail, the light emission control line EML may include a plurality of first light emission control lines EML1 and a plurality of second light emission control lines EML2. As shown in FIGS. 11 to 13, each of the plurality of first light emission control lines EML1 may be provided in a layer different from the initialization line IL, and at least a portion of the plurality of first light emission control lines EML1 may overlap the initialization line IL.

In one embodiment, each of the first light emission control lines EML1 may be provided over the initialization line IL. Each of the plurality of circuit areas CAL CA2, CA3 and CA4 may include a driving transistor including an active layer, a gate electrode, a source electrode and a drain electrode. For example, the first light emission control line EML1 may be formed of the same material as that of the source electrode and the drain electrode of the driving transistor in the same layer as the source electrode and the drain electrode of the driving transistor. The initialization line IL may be formed of the same material as that of the gate electrode of the driving transistor in the same layer as the gate electrode of the driving transistor.

The plurality of first light emission control lines EML1 may respectively be provided between the pixels P disposed to be adjacent to each other along the first direction, and may be spaced apart from each other. Two first light emission control lines EML1 disposed to be adjacent to each other along the first direction may electrically be connected with each other through at least one second light emission control line EML2.

One end of each of the plurality of first light emission control lines EML1 may be diverged into a first divergence line and a second divergence line, the other end may be diverged into a third divergence line and a fourth divergence line. Each of the first divergence line, the second divergence line, the third divergence line and the fourth divergence line may be connected to the second light emission control line EML2 through a contact hole CH.

In one embodiment, two first light emission control lines EML1 disposed to be adjacent to each other along the first direction may electrically be connected with each other through two second light emission control lines EML2.

As an example, each of the first divergence line of one first light emission control line EML1 and the third divergence line of the other first light emission control line EML1, which is disposed to be adjacent to the first divergence line, may be connected to one second light emission control line EML2 through the contact hole CH. In addition, each of the second divergence line of one first light emission control line EML1 and the fourth divergence line of the other first light emission control line EML1, which is disposed to be adjacent to the second divergence line, may be connected to the other second light emission control line EML2 through the contact hole CH.

Each of the plurality of second light emission control lines EML2 may be provided in a layer different from the first light emission control line EML1.

In one embodiment, each second light emission control line EML2 may be provided in the same layer as the initialization line IL. For example, the second light emission control line EML2 and the initialization line IL may be formed of the same material as that of the source electrode and the drain electrode of the driving transistor in the same layer as the source electrode and the drain electrode of the driving transistor. At this time, the second light emission control line EML2 may be spaced apart from the initialization line IL.

Although the transparent display panel 110 according to one embodiment of the present disclosure is driven in a DRD method, increasing an area for forming the first signal line portion SL1 extended in the first direction may be reduced or minimized.

In detail, in the transparent display panel 110 according to one embodiment of the present disclosure, the first unit pixel UP1 and the second unit pixel UP2 may share the initialization line IL and the light emission control line EML, whereby the number of the initialization lines IL and the number of the light emission control lines EML may be reduced to ½.

In addition, in the transparent display panel 110 according to one embodiment of the present disclosure, the light emission control line EML may be formed to overlap the initialization line IL in at least a partial area. In the transparent display panel 110 according to one embodiment of the present disclosure, the light emission control line EML may be diverged into a plurality of divergence lines in the pixel P having a large design space and then the divergence lines may respectively be connected to the plurality of circuit areas CA1, CA2, CA3 and CA4, whereby the light emission control signal may stably be supplied to the plurality of circuit areas CA1, CA2, CA3 and CA4.

Meanwhile, in the transparent display panel 110 according to one embodiment of the present disclosure, the light emission control line EML and the initialization line IL overlap each other between the pixels P1, whereby the area for forming the first signal line portion SL1 may be reduced or minimized.

According to the present disclosure, the following advantageous effects may be obtained.

In the present disclosure, two unit pixels may correspond to one transmissive area. Therefore, a total size of the transmissive area may be increased, whereby high transmittance may be obtained and at the same time high resolution may be obtained.

As the transparent display panel of the present disclosure is driven in a DRD method, the area for forming the second signal line portion extended in the second direction may be reduced. Also, although the transparent display panel of the present disclosure is driven in a DRD method, increasing the area for forming the first signal line portion extended in the first direction may be reduced or minimized. As a result, the present disclosure may improve transmittance.

In addition, the arrangement order of the subpixels may be different in the first pixel overlapped with the first signal line of the odd row and the second pixel overlapped with the second signal line of the even row. The present disclosure may have an optimal pixel structure, thereby preventing image quality from being degraded.

In addition, the present disclosure may improve definition in image quality and readability as the plurality of subpixels are collectively disposed based on the intersection or overlapping area where the first signal line and the second signal line cross or overlap each other.

It will be apparent to those skilled in the art that the present disclosure described above is not limited by the above-described embodiments and the accompanying drawings and that various substitutions, modifications, and variations can be made in the present disclosure without departing from the spirit or scope of the disclosures.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transparent display device comprising:
    a plurality of first signal line portions extended in a first direction, each of the first signal line portions including a first sensing scan line, a second sensing scan line, an initialization line and a light emission control line;
    a plurality of second signal line portions extended in a second direction;
    a transmissive area provided between two first signal line portions of the plurality of first signal lines that are adjacent to each other and between two second signal line portions of the plurality of second signal lines that are adjacent to each other; and
    a pixel provided in areas where one of the first signal line portions and one of the second signal line portions overlap each other,
    wherein the light emission control line overlaps the initialization line in at least a partial area.

2. The transparent display device of claim 1, wherein the light emission control line includes a plurality of first light emission control lines and a plurality of second light emission control lines,
    wherein the plurality of first emission control lines is provided in a layer different from the initialization line, the plurality of first emission control lines overlapped with the initialization line at the least the partial area, and
    wherein the plurality of second light emission control lines is provided in a same layer as the initialization line and spaced apart from the initialization line.

3. The transparent display device of claim 2, wherein the plurality of first light emission control lines is spaced apart from each other, and two first light emission control lines of the plurality of first light emission control disposed to be adjacent to each other along the first direction are electrically connected with each other through at least one second light emission control line of the plurality of second light emission control lines.

4. The transparent display device of claim 2, wherein the pixel includes a first pixel and a second pixel that are disposed to be adjacent to each other along the first direction, the plurality of first light emission control lines are provided between the first pixel and the second pixel.

5. The transparent display device of claim 2, wherein each of the plurality of first light emission control lines has a first end diverged into a first divergence line and a second divergence line and a second end diverged into a third divergence line and a fourth divergence line, and each of the first divergence line, the second divergence line, the third divergence line and the fourth divergence line is connected to a corresponding second light emission control line of the second light emission control lines through a contact hole.

6. The transparent display device of claim 1, wherein the pixel includes a first unit pixel including:
a first subpixel configured to emit light of a first color and a second subpixel configured to emit light of a second color and
a second unit pixel including the second subpixel and a third subpixel configured to emit light of a third color,
wherein the first sensing scan line configured to provide a first sensing scan signal to one of the subpixels included in the first unit pixel and one of the subpixels included in the second unit pixel, and
wherein the second sensing scan line configured to provide a second sensing scan signal to one of the subpixels included in the first unit pixel and one of the subpixels included in the second unit pixel.

7. The transparent display device of claim 6, wherein the initialization line is configured to provide an initialization signal to the first unit pixel and the second unit pixel, and
wherein the light emission control line is configured to provide a light emission control signal to the first unit pixel and the second unit pixel.

8. The transparent display device of claim 6, wherein the first pixel is overlapped with at least a part of a first signal line portion of the plurality of a first signal line portions in an odd row,
wherein a second pixel is overlapped with at least a part of a first signal line portion of the plurality of a first signal line portions in an even row, and
wherein the first pixel and the second pixel are different from each other in positions of the first unit pixel and the second unit pixel.

9. The transparent display device of claim 6, wherein each of the second signal line portions includes a first data line configured to supply a first data voltage to the subpixels included in the first unit pixel, and a second data line configured to supply a second data voltage to the subpixels included in the second unit pixel.

10. A transparent display device comprising:
a plurality of first signal line portions extended in a first direction, each of the first signal line portions including a first line;
a plurality of second signal line portions extended in a second direction;
a transmissive area provided between two adjacent first signal line portions of the plurality of first signal line portions and between two adjacent second signal line portions of the plurality of second signal line portions; and
a plurality of circuit areas disposed based on an intersection where one of the first signal line portions and one of the second signal line portions overlap each other,
wherein the first line includes a straight line portion and a divergence portion diverged from the straight line portion, providing a signal to each of the plurality of circuit areas,
wherein the diverged portion is provided by diverging the straight line portion into a plurality of divergence lines.

11. The transparent display device of claim 10, wherein each of the first signal line portions further includes a second line, the second line provided in a layer different from the first line and overlapped with the first line in at least a partial area.

12. The transparent display device of claim 11, wherein the first line is overlapped with the second line in the straight line portion.

13. The transparent display device of claim 11, wherein the first line is provided in the divergence portion to surround the plurality of circuit areas, and the second line is provided between the plurality of circuit areas.

14. The transparent display device of claim 11, wherein the first line is a light emission control line for providing a light emission control signal to the plurality of circuit areas, and the second line is an initialization line for providing an initialization signal to the plurality of circuit areas.

15. The transparent display device of claim 14, wherein each of the first signal line portions further includes a first sensing scan line for providing a first sensing scan signal to a portion of the plurality of circuit areas, and a second sensing scan line for providing a second sensing scan signal to the other portion of the plurality of circuit areas, and the first sensing scan line and the second sensing scan line are symmetrical to each other based on the initialization line.

16. The transparent display device of claim 14, wherein the light emission control line includes a plurality of first light emission control lines provided in a layer different from the initialization line, having at least a partial area overlapped with the initialization line, and a plurality of second light emission control lines provided in the same layer as the initialization line and spaced apart from the initialization line.

17. The transparent display device of claim 16, wherein each of the plurality of first light emission control lines has one end diverged into a first divergence line and a second divergence line and the other end diverged into a third divergence line and a fourth divergence line, and each of the first divergence line, the second divergence line, the third divergence line and the fourth divergence line is connected to a corresponding second light emission control line of the plurality of second light emission control lines through a contact hole.

18. The transparent display device of claim 16, wherein each circuit area includes a driving transistor including an active layer, a gate electrode, a source electrode and a drain electrode, each of the first light emission control lines is provided in the same layer as the source electrode and the drain electrode, and each of the second light emission control lines is provided in the same layer as the gate electrode.

* * * * *